(12) United States Patent
Konopka et al.

(10) Patent No.: US 8,917,084 B2
(45) Date of Patent: Dec. 23, 2014

(54) HIGH VOLTAGE SENSING MECHANISM WITH INTEGRATED ON-OFF SWITCH

(75) Inventors: John G. Konopka, Spring Grove, IL (US); Alex K. Choi, Lake Zurich, IL (US); David A. Konopka, Grayslake, IL (US)

(73) Assignee: Synergistic Technology Solutions, Inc., Mundelein, IL (US)

( * ) Notice: Subject to any disclaimer, the term of this patent is extended or adjusted under 35 U.S.C. 154(b) by 422 days.

(21) Appl. No.: 13/540,417

(22) Filed: Jul. 2, 2012

(65) Prior Publication Data
US 2013/0002239 A1    Jan. 3, 2013

Related U.S. Application Data

(60) Provisional application No. 61/503,709, filed on Jul. 1, 2011.

(51) Int. Cl.
    *G01R 1/06*      (2006.01)
    *G01R 1/067*     (2006.01)
    *G01R 1/07*      (2006.01)

(52) U.S. Cl.
CPC ........ *G01R 1/06777* (2013.01); *G01R 1/06788* (2013.01); *G01R 1/07* (2013.01)
USPC .......... 324/149; 324/126; 324/511; 324/72.5; 324/522; 324/750.01; 340/635; 340/642; 361/679.01

(58) Field of Classification Search
USPC ........... 324/149, 126, 127, 511, 72.5, 750.01, 324/177, 755.01, 723, 522; 340/635, 642; 361/679.01
See application file for complete search history.

(56) References Cited

U.S. PATENT DOCUMENTS

| | | | | |
|---|---|---|---|---|
| 3,315,163 A * | 4/1967 | Lutz | ............... | 324/149 |
| 4,121,068 A * | 10/1978 | Peck | ............... | 200/437 |
| 4,825,154 A * | 4/1989 | Cross et al. | ............... | 324/127 |
| 5,607,436 A * | 3/1997 | Pratt et al. | ............... | 606/143 |
| 5,670,762 A * | 9/1997 | Futamura | ............... | 200/16 D |
| 5,800,043 A * | 9/1998 | Walkerow | ............... | 362/119 |
| 5,867,019 A * | 2/1999 | Malenko et al. | ............... | 324/72.5 |
| 6,319,076 B1 * | 11/2001 | Gollhofer et al. | ............... | 439/862 |
| 7,507,926 B2 * | 3/2009 | Kawamura et al. | ............... | 200/548 |
| 7,710,237 B2 * | 5/2010 | Kato | ............... | 338/160 |
| 7,753,918 B2 * | 7/2010 | Hartley et al. | ............... | 606/108 |
| 8,602,125 B2 * | 12/2013 | King | ............... | 173/221 |
| 2005/0189153 A1 * | 9/2005 | Yang | ............... | 177/148 |

\* cited by examiner

*Primary Examiner* — Tung X Nguyen
*Assistant Examiner* — Thang Le

(57) ABSTRACT

The present invention is an efficient high voltage sensing mechanism that operates only when an individual needs to test the voltage across a wire. The present invention attaches around a tested wire using a jaw and a hook. The hook is tensioned using an expansion spring. The operator propels the hook outwards from the jaw, around the tested wire; thereafter, the expansion spring retracts to latch onto the tested wire against the jaw. An on-off switch is integrated into the mechanical hook device. As the hook is propelled outwards, the on-off switch moves into the "on" position, which powers the electrical processing and voltage analysis equipment. Once the hook is returned to the initial position, the on-off switch moves to the "off" position. This arrangement allows the present invention to remain unpowered for any instance a wire is not being tested. The present invention detects voltage through capacitive coupling.

16 Claims, 44 Drawing Sheets

HIGH VOLTAGE SENSING MECHANISM WITH INTEGRATED ON-OFF SWITCH

The current application claims a priority to the U.S. Provisional Patent application Ser. No. 61/503,709 filed on Jul. 1, 2011. The current application filed in U.S. Jul. 2, 2012 while Jul. 1, 2012 was on a weekend.

FIELD OF THE INVENTION

The present invention relates generally to voltage detectors. In particular, the object of the present invention is to detect voltage in a wire without a user needing to physically operate a voltage detection device.

BACKGROUND OF THE INVENTION

It is often useful to detect whether voltage is currently is present in a particular item, such as an insulated wire. For example, engine ignition analyzers are used to diagnose engine spark plugs that are defective or in need of replacement. Unfortunately, these existing engine ignition analyzers, as well as other types of voltage detection devices, have several drawbacks, requiring a useful improvement. Most voltage detection analyzers are powered using batteries. Also, on-off switches are used in tandem with the battery in order to regulate when the power is permitted to flow. If the switch is in the "on" position, this indicates power is permitted to flow from the battery to the electrical components. If the switch is in the "off" position, this indicates that the flow of power from the battery is restricted, in which the electrical components do not receive power. The problem that occurs with such voltage detection analyzers is that an individual is very likely to leave the switch in the "on" position after using the device, unaware that the power is draining from the battery. Also, a problem with the aforementioned voltage analyzers, the engine ignition analyzers in particular, is that these require the spark plug to be disconnected, and the analyzer put in series with the high voltage cable, in order to be tested.

The object of the present invention is to provide a voltage detection device suitable for use as an engine ignition analyzer with an integrated on-off switch; however, the present invention could be used in any voltage detection applications. The present invention should be capable of recognizing that a user is no longer operating the device. Upon recognizing this situation, the present invention should thereafter turn off the device, preventing the power from becoming drained, unnecessarily. It is a further object of the present invention to be able to quickly perform voltage detection tests. In terms of the engine ignition analyzer, the spark plugs of the engine should not be required to be disconnected in order to perform the voltage detection tests. Furthermore, the present invention should have a "hands-free" capability in which the user does not need to physically handle the device during the voltage detection tests. This could be achieved by clipping the device onto an insulated wire to be tested.

DETAIL DESCRIPTIONS OF THE INVENTION

Figure 1:
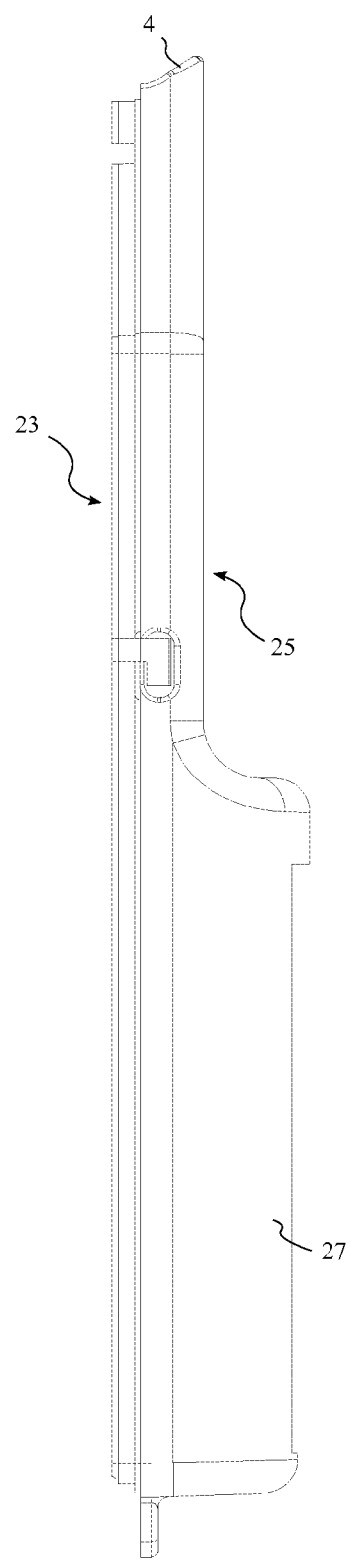
FIG. 1 is a side elevational view of the present invention.
Figure 2:
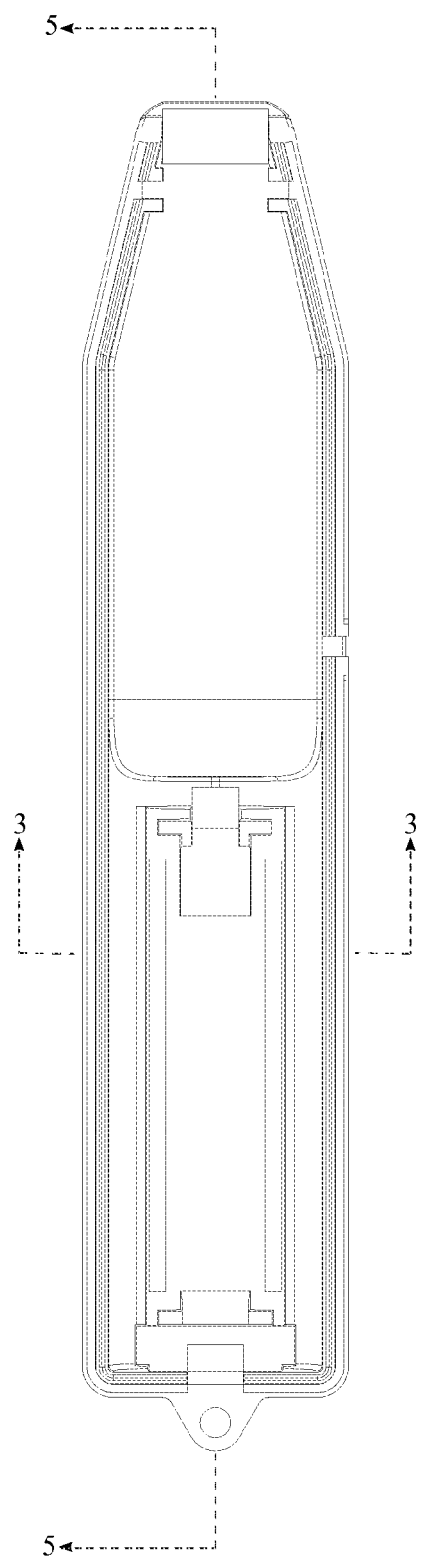
FIG. 2 is a top view of the present invention, showing the plane 3-3 and the plane 5-5 which a cross section is taken.
Figure 3:
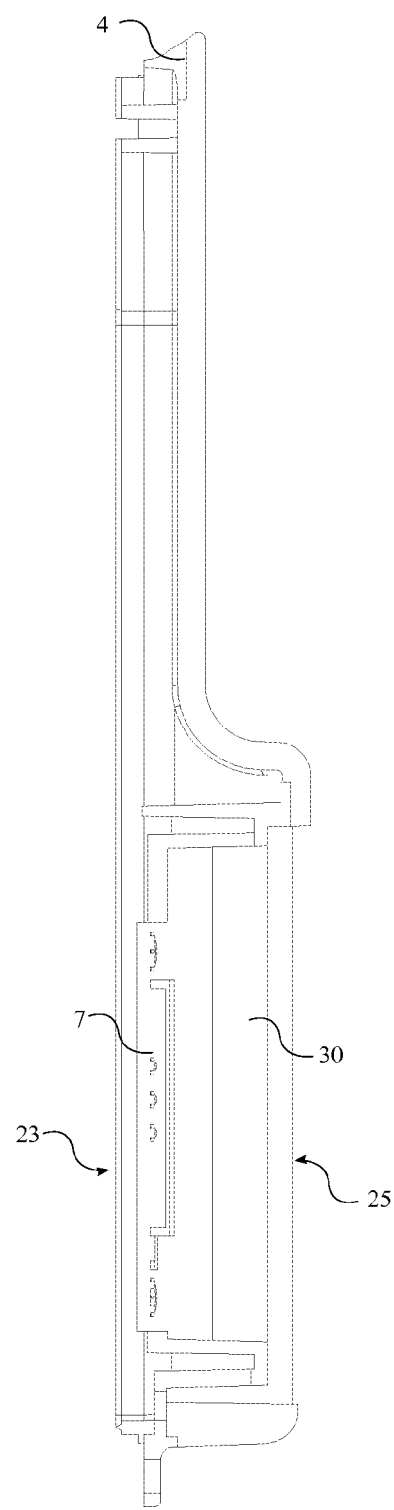
FIG. 3 is a left cross sectional view of the present invention, taken along the plane 3-3.
Figure 4:
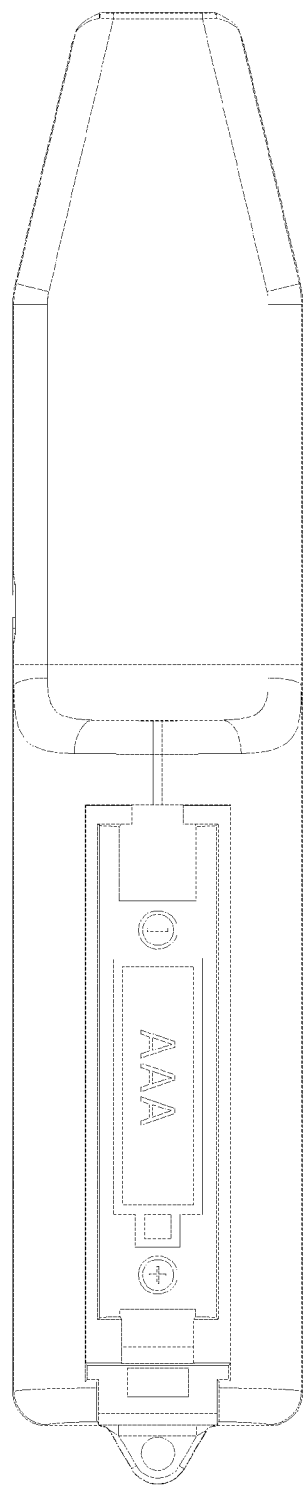
FIG. 4 is a bottom view of the present invention.
Figure 5:
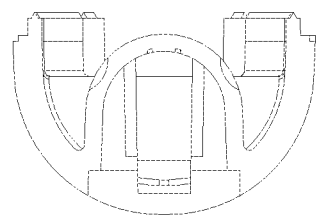
FIG. 5 is a rear cross sectional view of the present invention, taken along the plane 5-5.
Figure 6:
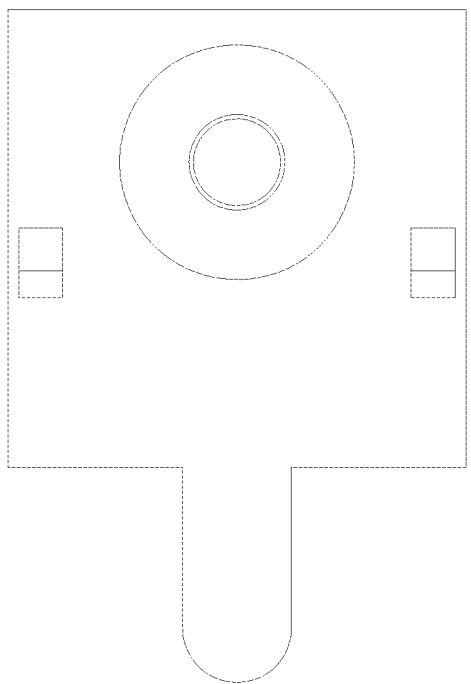
FIG. 6 is a rear view of the first contact.
Figure 7:
FIG. 7 is a right side view of the first contact.

All illustrations of the drawings are for the purpose of describing selected versions of the present invention and are not intended to limit the scope of the present invention.

As is shown in FIG. 1-FIG. 44, the present invention is a high voltage sensing mechanism with an integrated on-off switch. The present invention comprises a sliding gripper 1, an on-off switch 2, an electronics encasement 3, an expansion spring 6, an electrical processor 7, a power source 5, a metal contact plate 8, and a rivet 9. The present invention is capable of detecting the pulse voltage level through an object, particularly an insulated wire. The present invention detects the voltage and determines the voltage level using the electrical processor 7. The power source 5 supplies energy to the electrical processor 7 in order for the electrical processor 7 to function. The flow of electricity, particular the presence of a voltage pulse, is detected using electrical sensing equipment. This electrical sensing equipment acquires an electrical signal through capacitive coupling. Through a mechanical arrangement of the components within the electronics encasement 3, the present invention is capable of automatically powering and depowering the electrical processor 7. An on-off switch 2 is integrated into the mechanical components to provide this capability. Such an on-off switch 2 can either be positioned to be in the "on" position, or the "off" position. If the on-off switch 2 is in the "off" position, the flow of power is restricted from the electrical processor 7; concurrently, if the on-off switch 2 is in the "on" position, the flow of power is permitted to transfer to the electrical processor 7. While not being operated, the electrical processor 7 should not draw energy from the power source 5—the on-off switch 2 should remain positioned in the "off" position. A set of jaws must be mechanically opened in order to reposition the on-off switch 2 into the "on" position. The set of jaws are used to latch onto a wire being tested. As soon as the set of jaws are opened, the on-off switch 2 is mechanically forced into the "on" position. On the contrary, once the jaws are removed from the wire, the on-off switch 2 should return to its initial "off" position.

As is shown in FIG. 28-FIG. 31, the sliding gripper 1 comprises a first gripper surface 10, a second gripper surface 11, a first gripper end 12, a second gripper end 13, a front hook 14, a spring connector 15, a plurality of gripping teeth 16, and a gripper knob 17. The two ends of the sliding gripper 1, the first gripper end 12 and the second gripper end 13, are positioned oppositely to each other. Also, the first gripper surface 10 is positioned oppositely to the second gripper surface 11. The front hook 14 is connected to the first gripper end 12. As aforementioned, the present invention uses a set of jaws to latch onto a wire to be tested; the front hook 14 is an integral to the latching function of the set of jaws. Along the surface of the front hook 14 is a plurality of gripping teeth 16. These gripping teeth 16 are notches or splines that protrude from the surface of the front hook 14 in order to supply a tight and secure grip with a tested wire. It is undesirable to allow the tested wire to deviate in any direction from the front hook 14, so the plurality of gripping teeth 16 assists in retaining validity in the determinations of the electrical processor 7. The gripper knob 17 is positioned atop the first gripper surface 10. A user actuates the sliding gripper 1, along with the activating the electrical processor 7, by first pushing the gripper knob 17. The spring connector 15 is positioned adjacently to the second gripper end 13. Essentially, the spring connector 15 is a rivet 9 on the sliding gripper 1 that allows the expansion spring 6 to be attached to the sliding gripper 1.

Figure 35:
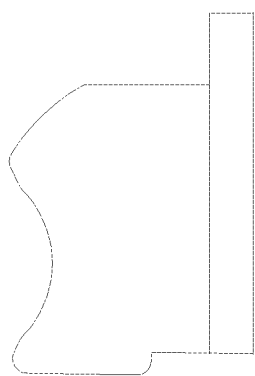
FIG. 35 is a right side view of the front jaw.
Figure 36:
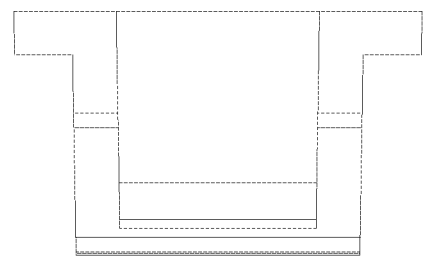
FIG. 36 is a front view of the front jaw.

As is shown in FIG. 1-FIG. 5, the electronics encasement 3 comprises a top cover 23, a bottom cover 25, a support plate 26, a front jaw 4, a sliding passage 31, a hook opening 32, and a battery encasement 27. Furthermore, the top cover 23 comprises a fixed post 24 and a gripper knob opening 37. The electronics encasement 3 houses the electronics and any electrical devices of the present invention, while also allowing the mechanical functions of the present to operate as desired. This is achieved by embedding the battery encasement 27 within the bottom cover 25 and the electrical processor 7 within the top cover 23. Also, the support plate 26 should be attached atop the battery encasement 27 and the top cover 23 should be secured to the bottom cover 25. A void should be formed between the support plate 26 and the top cover 23. This void is described as the sliding passage 31. The sliding passage 31 should traverse through the electronics encasement 3 to the hook opening 32. The sliding gripper 1 is fitted within and able to translate with the sliding passage 31. The ingenuity of the present invention to implement an integrated on-off switch 2 and to achieve a hands-free operable capability is attained by allowed the sliding gripper 1 to translate within the sliding passage 31. The fixed post 24 can be a protrusion that extends from the top cover 23 into the sliding passage 31. The purpose of the fixed support is to provide the expansion spring 6 with a fixed structure to be secured onto. In order to induce tension or compression within the expansion spring 6, one end must be fixed in place. The front jaw 4 is attached to the electronics encasement 3, adjacently to the hook opening 32. The front jaw 4, as shown in FIG. 35-FIG. 36, remains fixed in place so that a wire can be latched between the front hook 14 and the front jaw 4; concurrently, the set of jaws is comprised of the front jaw 4 and the front hook 14.

Figure 32:
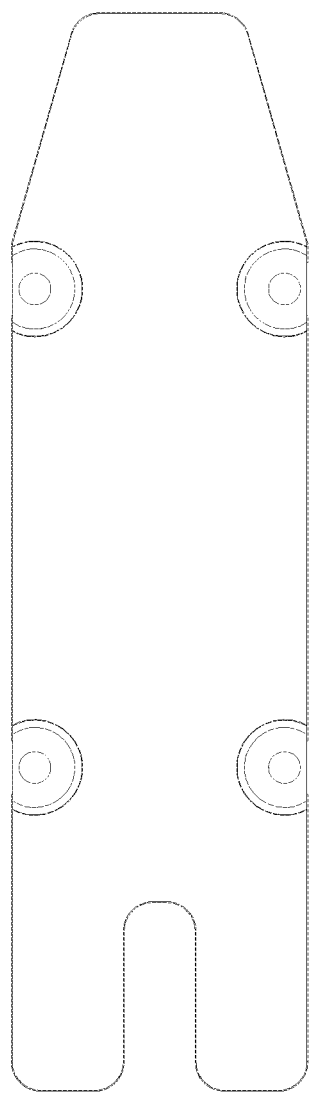
FIG. 32 is a top view of the support plate.
Figure 33:
FIG. 33 is a right side view of the support plate.
Figure 34:
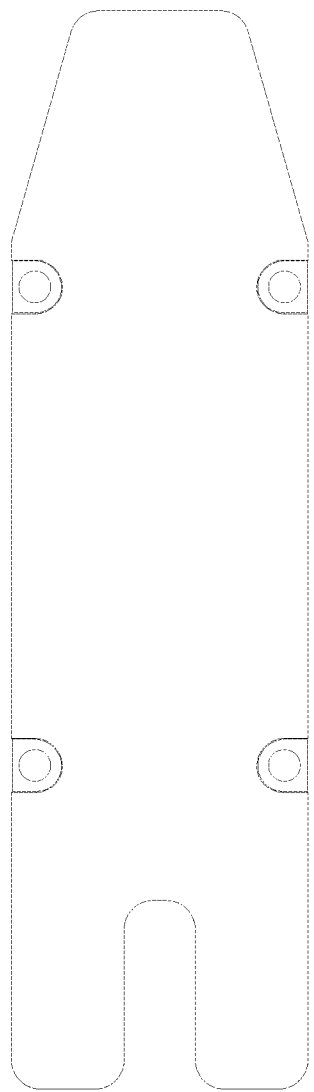
FIG. 34 is a bottom view of the support plate.

The support plate 26, as shown in FIG. 32-FIG. 34 provides an electrical contact medium between the power source 5 and the electrical processor 7. To this end, the support plate 26 should be electrically connected to the electrical processor 7. Also, the support plate 26 guides the sliding gripper 1 as it translates through the sliding passage 31 so that lateral motion can strictly be maintained. The metal contact plate 8 is attached to the support plate 26 near the front jaw 4. An example of the metal contact plate 8 is shown in FIG. 21-FIG. 26. The function of the metal contact plate 8 is to detect the voltage within a tested wire through capacitive coupling. Once the metal contact plate 8 detects the voltage from the tested ware, an electrical signal is sent from the metal contact plate 8 through the support plate 26 to the electrical processor 7. The electrical processor 7 determines the level of voltage upon receiving this electrical signal.

Figure 8:
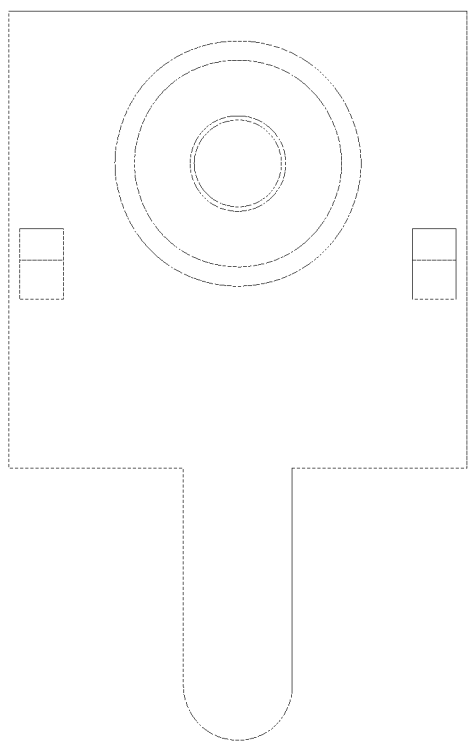
FIG. 8 is a front view of the first contact.
Figure 9:
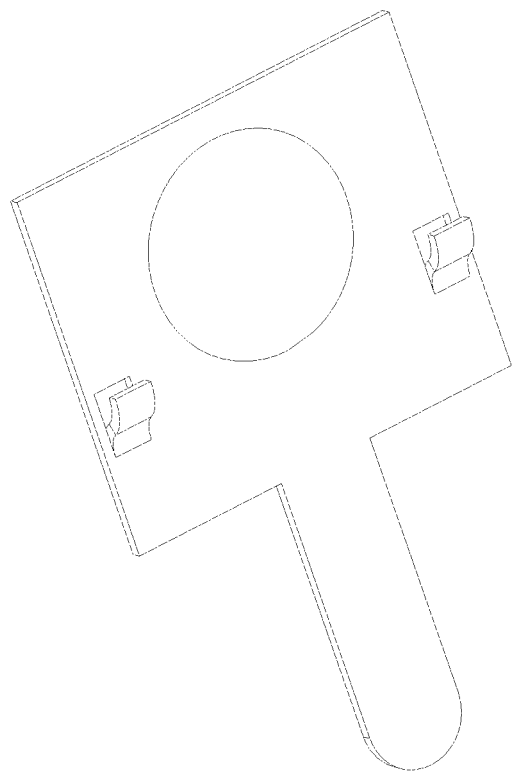
FIG. 9 is a perspective view of the first contact.
Figure 10:
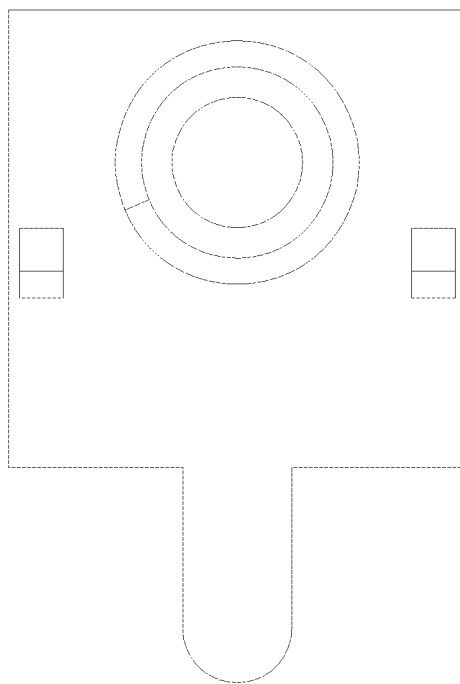
FIG. 10 is a front view of the second contact.
Figure 11:
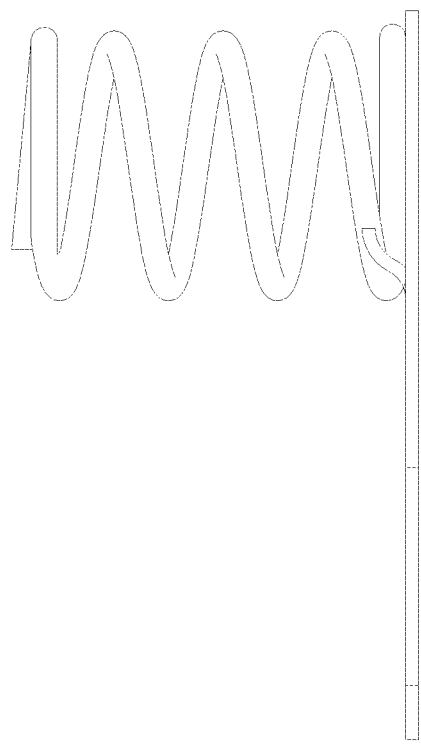
FIG. 11 is a side view of the second contact.
Figure 12:
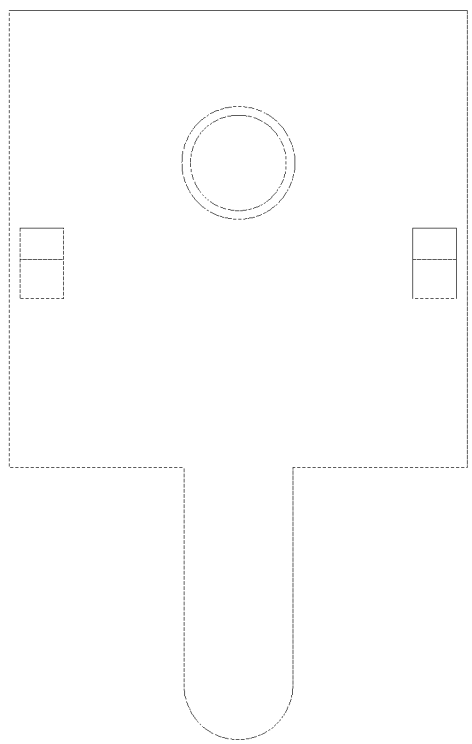
FIG. 12 is a rear view of the second contact.

Furthermore, the battery encasement 27 comprises a first contact 28, a second contact 29, and a power source cavity 30. Both the first contact 28 and the second contact 29 are housed within the power source cavity 30. The power source cavity 30 is a space within the battery encasement that the power source can be contained within; although, the present invention should not be limited by the location of the power source. The first contact 28 and the second contact 29 electrically connect the power source 5 to the electrical processor 7. Both the first contact 28 and the second contact 29 are electrically contacted with the support plate 26. FIG. 6-FIG. 9 shows the preferred embodiment of the first contact 28, and FIG. 10-FIG. 12 shows the preferred embodiment of the second contact 29. If the power source 5 is a battery, the positive end should touch the first contact 28, while the negative end should touch the second contact 29. If the on-off switch 2 is in the "on" position, then an electrical loop would be completed through the power source 5, a battery, allowing the stored electrical energy to be drawn by the electrical processor 7.

The electrical processor 7, which includes a plurality of illuminating sources 35, is embedded within the top cover 23. In the preferred embodiment of the present invention, the electrical processor 7 is a printed circuit board (PCB). This PCB should be capable of receiving energy from the power source 5 and then be capable of determining the voltage drop across the tested portion of the wire. The present invention should not be limited to a PCB, and any similar future or existing technology that is capable of making similar determinations could be used instead. The illuminating sources 35 should traverse through the top cover 23 into the environment. Each illuminating source 35 activates according to a specific determination by the electrical processor 7. For example, the present invention may utilize three illuminating sources 35—one to indicate that the tested wire has lower than normal voltage, and a second to indicate that the tested wire has higher than normal voltage. A third illuminating source indicates the wire voltage is within normal range. If the present invention is an engine ignition starter, the operator should be able to decide whether the engine ignition starter is faulty and needs replacement. Each of the plurality of illuminating sources 35 should be electrically connected to the electrical processor 7, in which the electrical processor 7 activates the corresponding illuminating source. In the preferred embodiment of the present invention, each of the plurality of illuminating sources 35 is light emitting diodes (LED's). LED's require less power and is more efficient, which allows the electrical processor 7 to draw less energy from the power source 5. This further increases the longevity of the power source 5.

Figure 13:
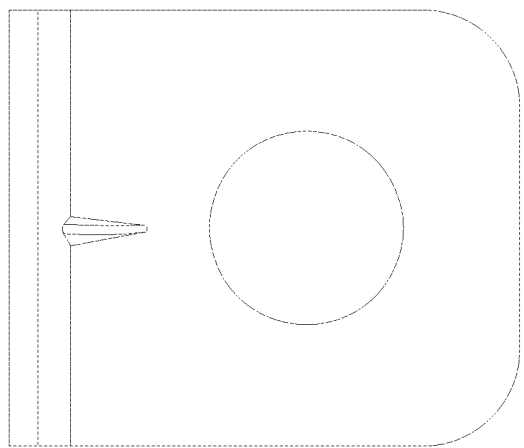
FIG. 13 is a top view of the third contact.
Figure 14:
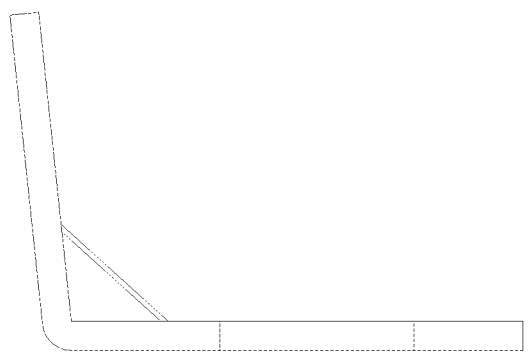
FIG. 14 is a left side view of the third contact.
Figure 15:
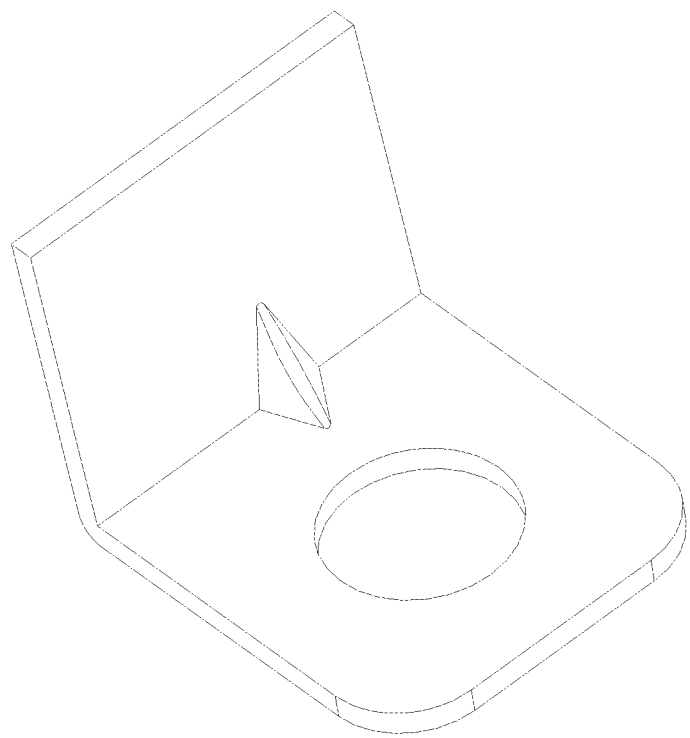
FIG. 15 is a left perspective view of the third contact.
Figure 16:
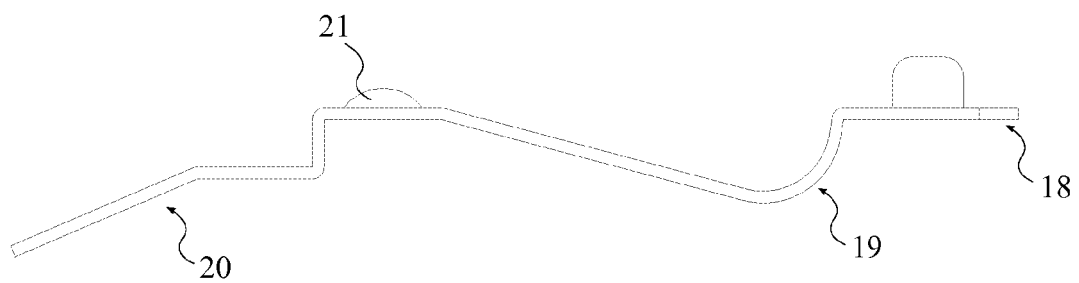
FIG. 16 is a right side view of the on-off switch.
Figure 17:
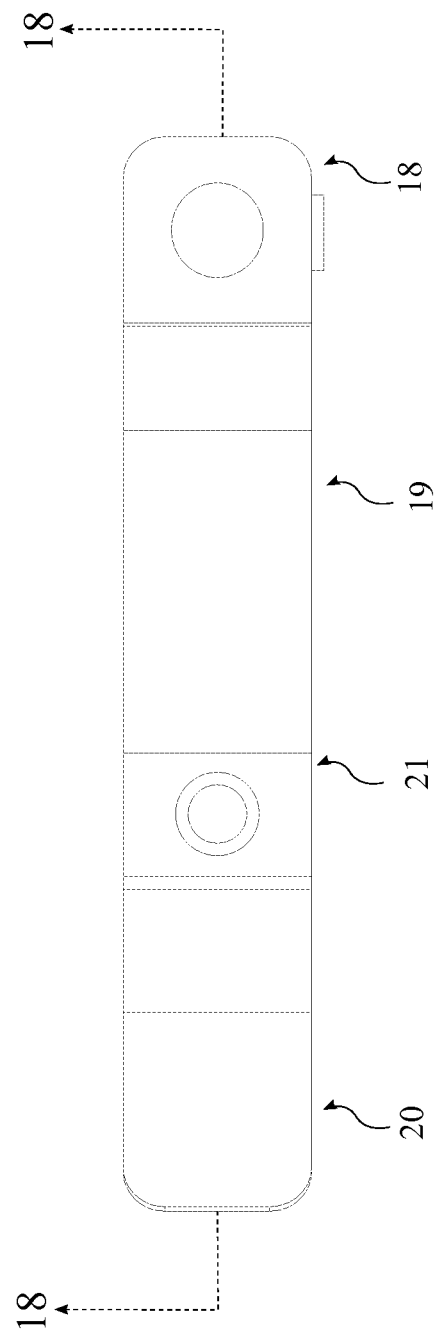
FIG. 17 is a top view of the on-off switch, showing the plane 18-18 which a cross section is taken.
Figure 18:
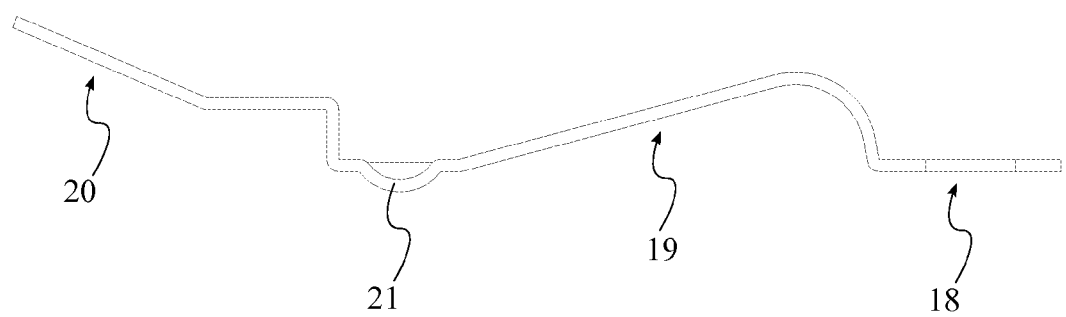
FIG. 18 is the left side cross sectional view of the on-off switch, taken along the plane 18-18.
Figure 19:
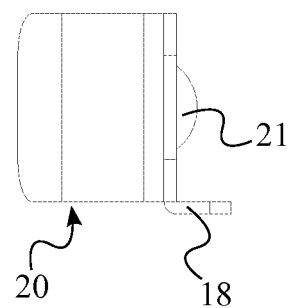
FIG. 19 is a front view of the on-off switch.
Figure 20:
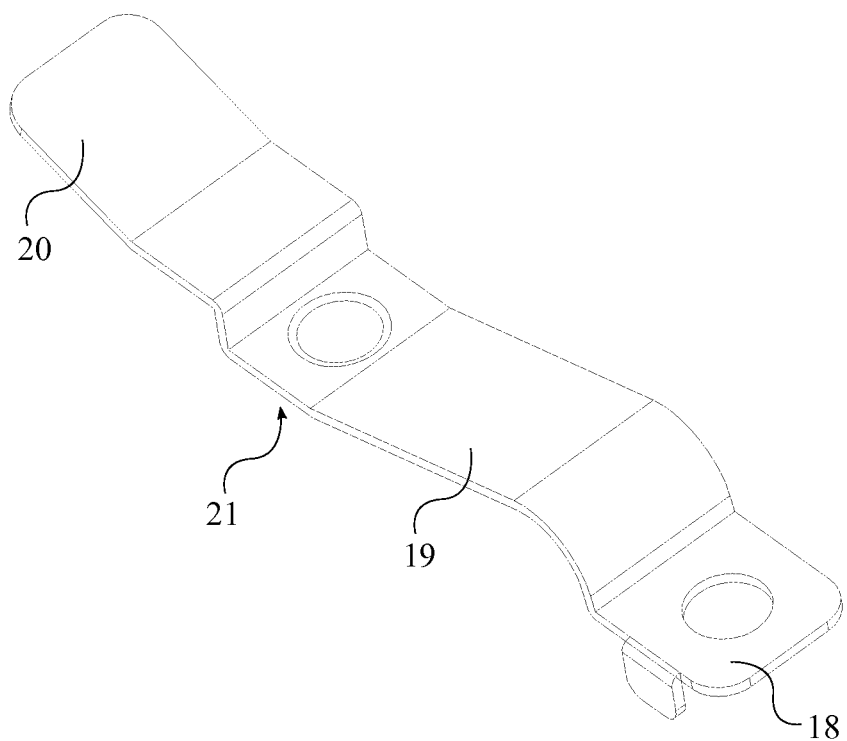
FIG. 20 is a perspective view of the on-off switch.
Figure 21:
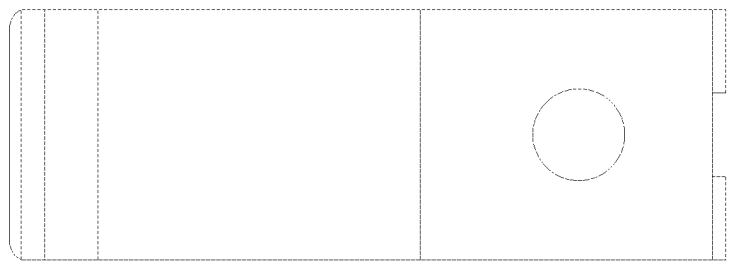
FIG. 21 is a top view of the metal pickup plate.
Figure 22:
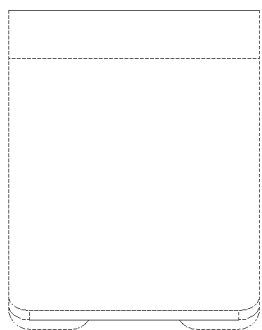
FIG. 22 is a rear view of the metal pickup plate.
Figure 23:
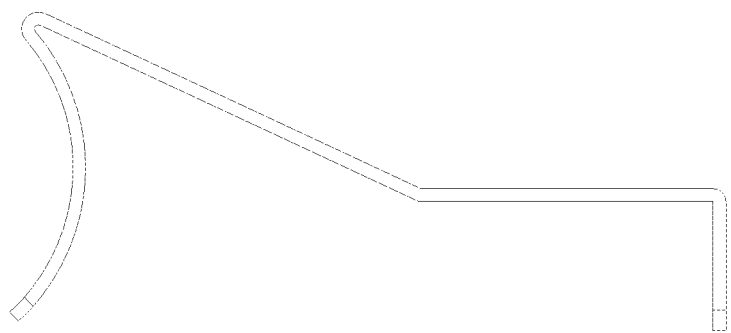
FIG. 23 is a right side view of the metal pickup plate.
Figure 24:
FIG. 24 is a bottom view of the metal pickup plate.
Figure 25:
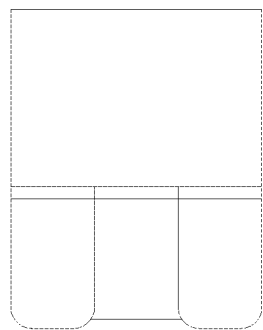
FIG. 25 is a front view of the metal pickup plate.
Figure 26:
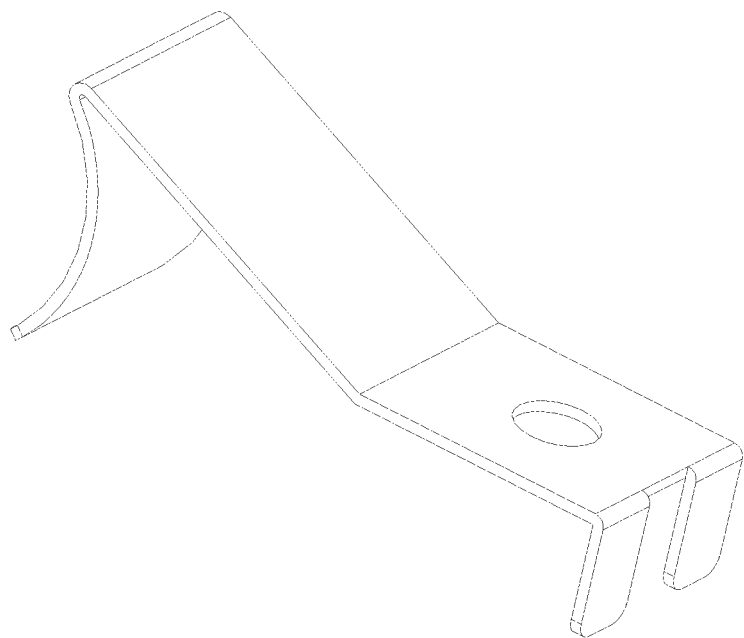
FIG. 26 is a perspective view of the metal pickup plate.
Figure 27:
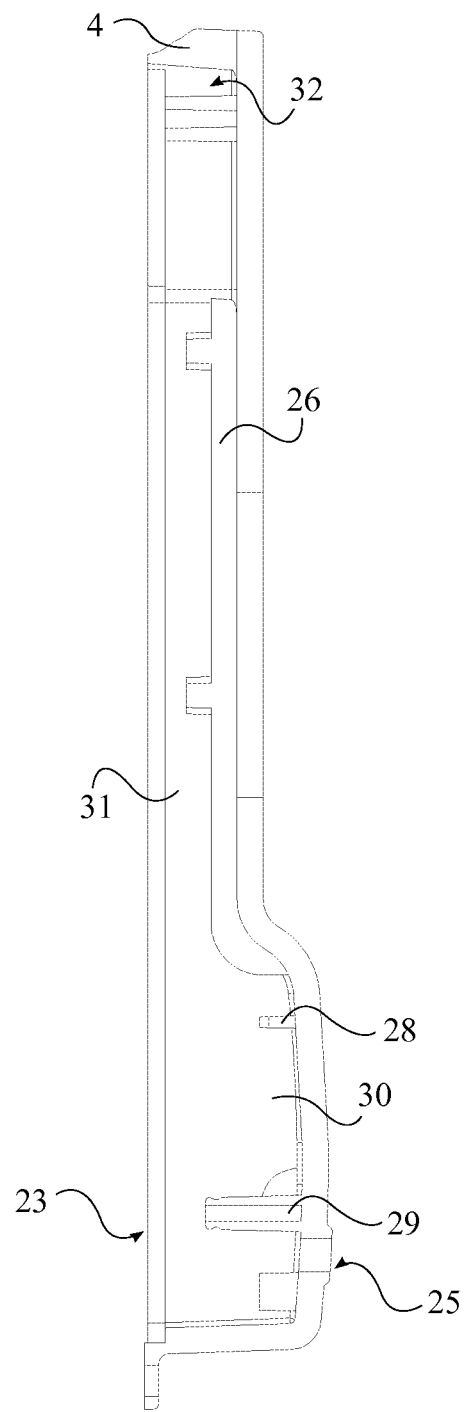
FIG. 27 is a side cross-sectional view of the present invention, taken along the plane 3-3 and showing the inner portion of the electronics encasement.
Figure 28:
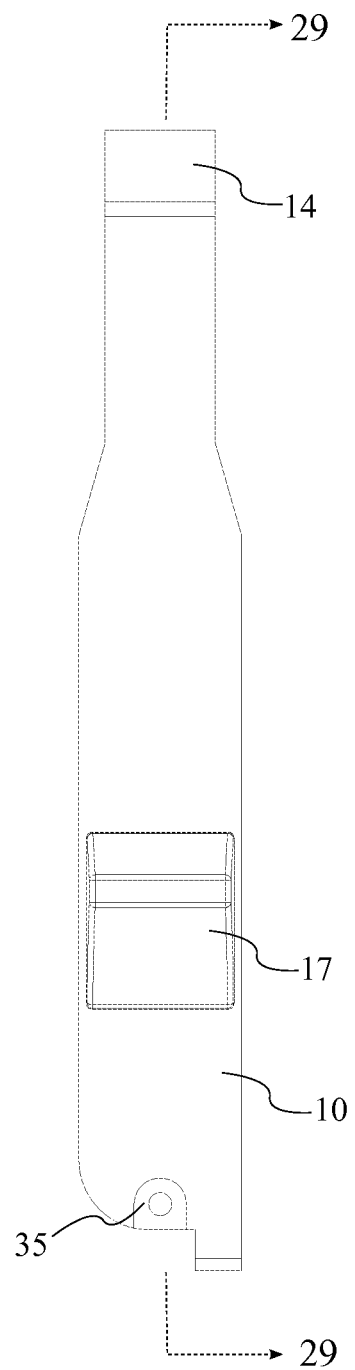
FIG. 28 is a top view of the sliding gripper, showing the plane 29-29 which a cross section is taken.
Figure 29:
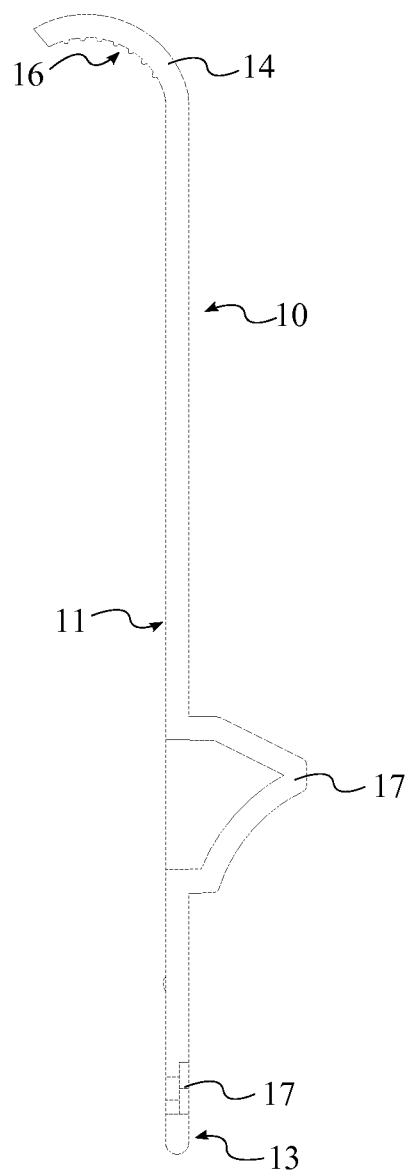
FIG. 29 is a right cross sectional view of the sliding gripper, taken along the plane 29-29.
Figure 30:
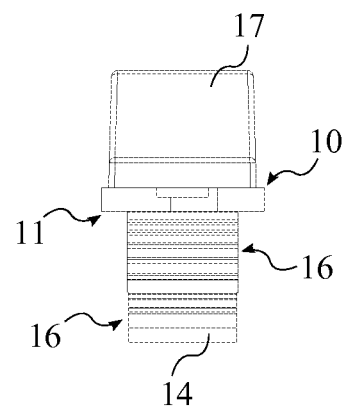
FIG. 30 is a rear view of the sliding gripper, showing the gripper knob.
Figure 31:
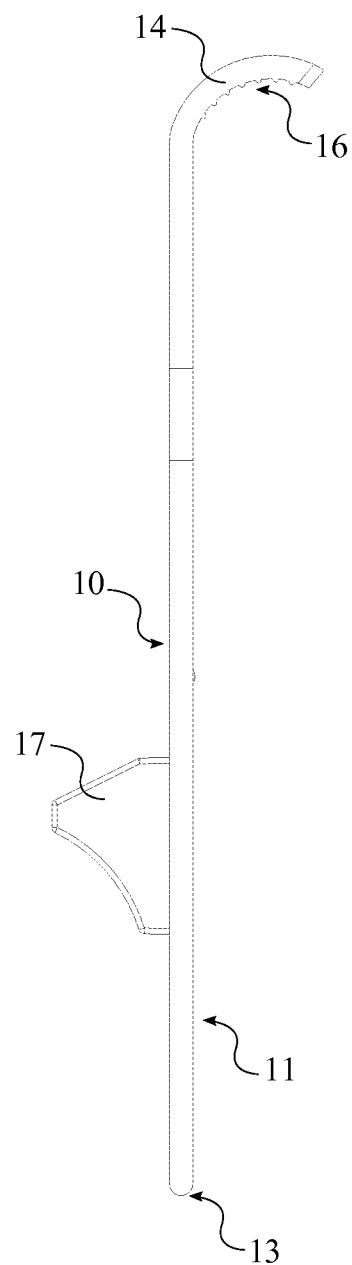
FIG. 31 is a left side view of the sliding gripper.
Figure 37:
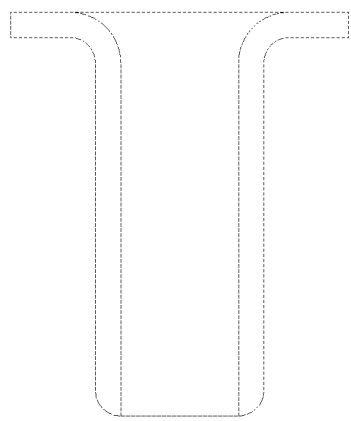
FIG. 37 is a side view of the rivet.

As is shown in FIG. 16-FIG. 20, the on-off switch 2 comprises a fixed section 18, a knee section 19, a contact point 21, a moveable section 20, and a third contact 22. Each section provides a necessary function to the overall function of the on-off switch 2. The on-off switch 2 is attached to the electrical processor 7 to complete an electrical loop with the power source 5. This electrical loop is dependent upon both the fixed section 18 and the contact point 21 touching the switch contact surface 36 of the electrical processor 7. The fixed section 18 is conjoined to the knee section 19, in which the knee section 19 is conjoined with the moveable section 20. The point at which the knee section 19 and the moveable section 20 are conjoined is denoted as the contact point 21. The fixed section 18 should be attached to the contact surface of the electrical processor 7. The third contact 22 functions as a brace to the fixed section 18 and the knee section 19. In the preferred embodiment of the present invention, the third contact 22 is an elbow joint, as is shown in FIG. 13-FIG. 15. The third contact 22 is an independent component and is used to attach the fixed section 18 to the electrical processor 7. The rivet 9, as shown in FIG. 37, secures third contact 22 and the fixed section 18 to the electrical processor 7.

The on-off switch 2 can either be in the "on" position or the "off" position. FIG. 8 and FIG. 9 illustrates the two alternate positions. The "off" position is described as the contact point 21 being near the switch contact surface 36, yet not touching the switch contact surface 36. This causes an open electrical loop between the power source 5 and the electrical processor 7. However, if the contact point 21 does touch the switch contact surface 36, the electrical loop between the power source 5 and the electrical processor 7 becomes closed, in which electricity is able to be drawn from the power source 5. The "on" position is described as the instance that the contact point 21 electrically contacts the switch contact surface 36. It should be know that the contact point 21 should be significantly distanced from the switch point while in the "off" position in order to prevent electrical charges from projecting from the switch contact point 21 to the switch contact surface 36, and that the present invention has been designed to avoid such a situation.

Figure 38:
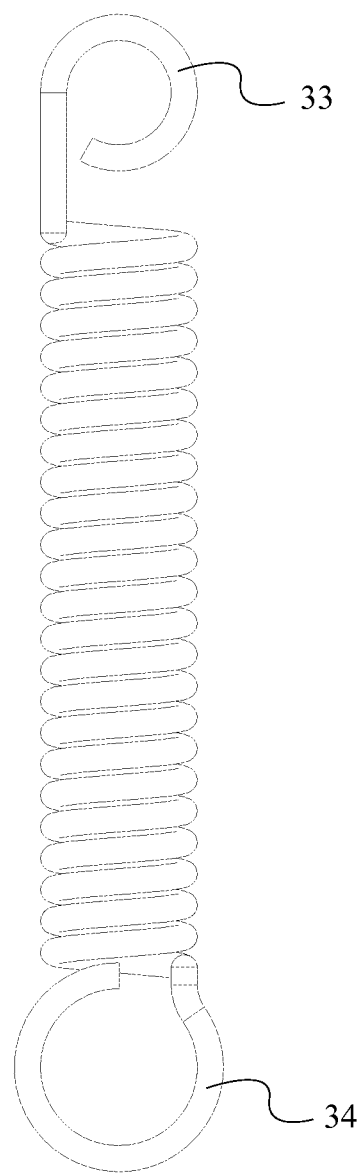
FIG. 38 is a top view of the expansion spring.

As is shown by FIG. 38, the expansion spring 6 comprises a first hooking end 33 and second hooking end 34. The first hooking end 33 is positioned oppositely to the second hooking end 34. The expansion spring 6 keeps the present invention unpowered while not being operated by forcing the on-off switch 2 into the "off" position. This is achieved by attaching the first hooking end 33 to the spring connector 15 and the second hooking end 34 to the fixed post 24. Since the sliding gripper 1 is able to translate within the sliding passage 31, the sliding gripper 1 should be pulled towards the fixed post 24 due to tension within the expansion spring 6.

Figure 39:
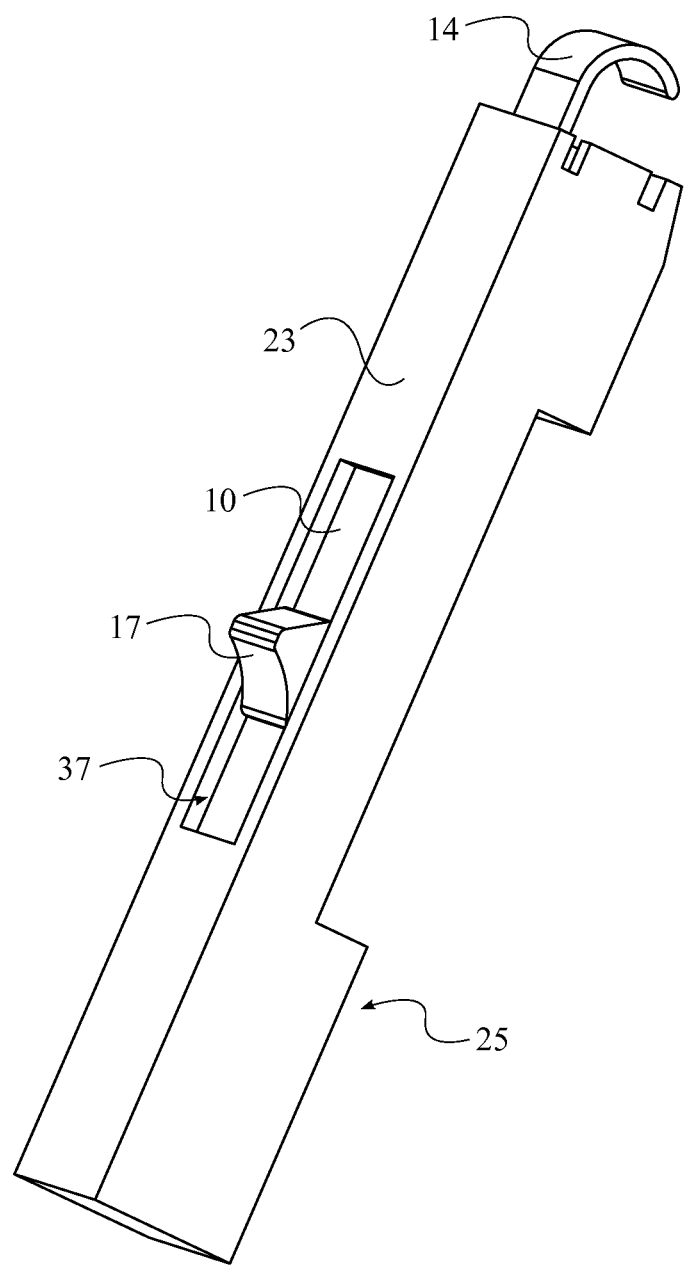
FIG. 39 is a perspective view of an alternate embodiment of the present invention, showing the "on" position.
Figure 40:
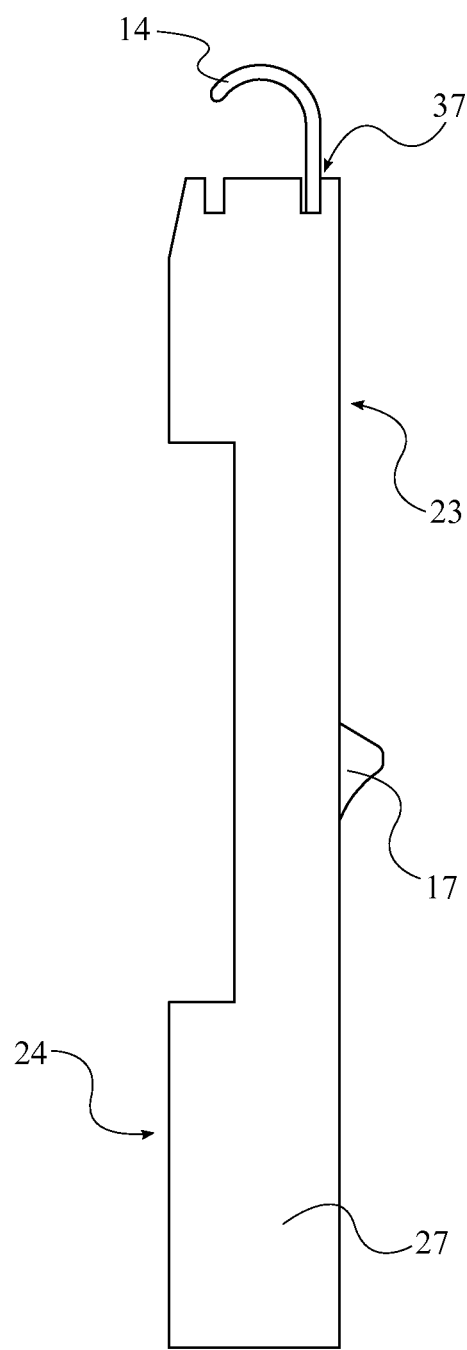
FIG. 40 is a side view of an alternate embodiment of the present invention, showing the "on" position.
Figure 41:
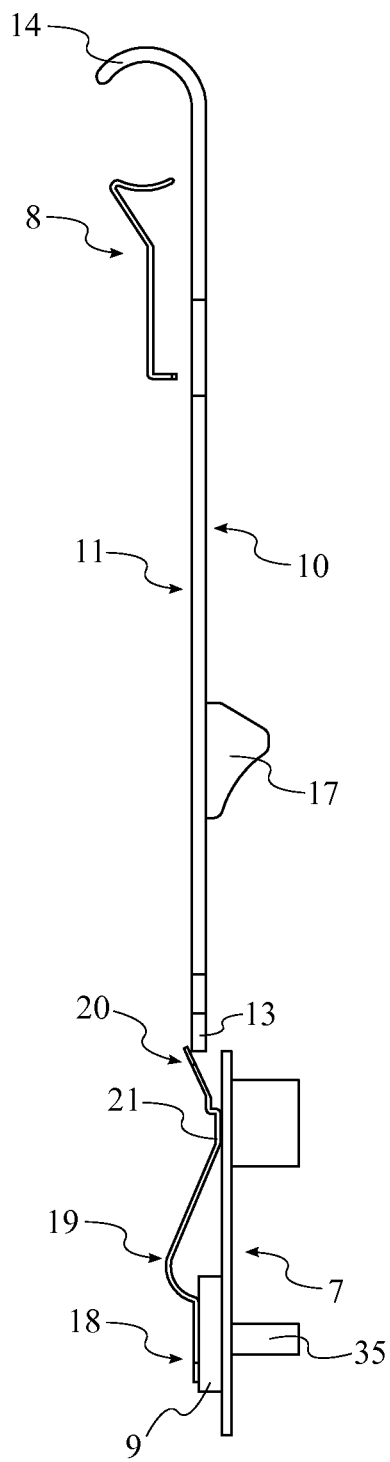
FIG. 41 is a side view of the mechanical arrangement of the inner components of the present invention, showing the "on" position.
Figure 42:
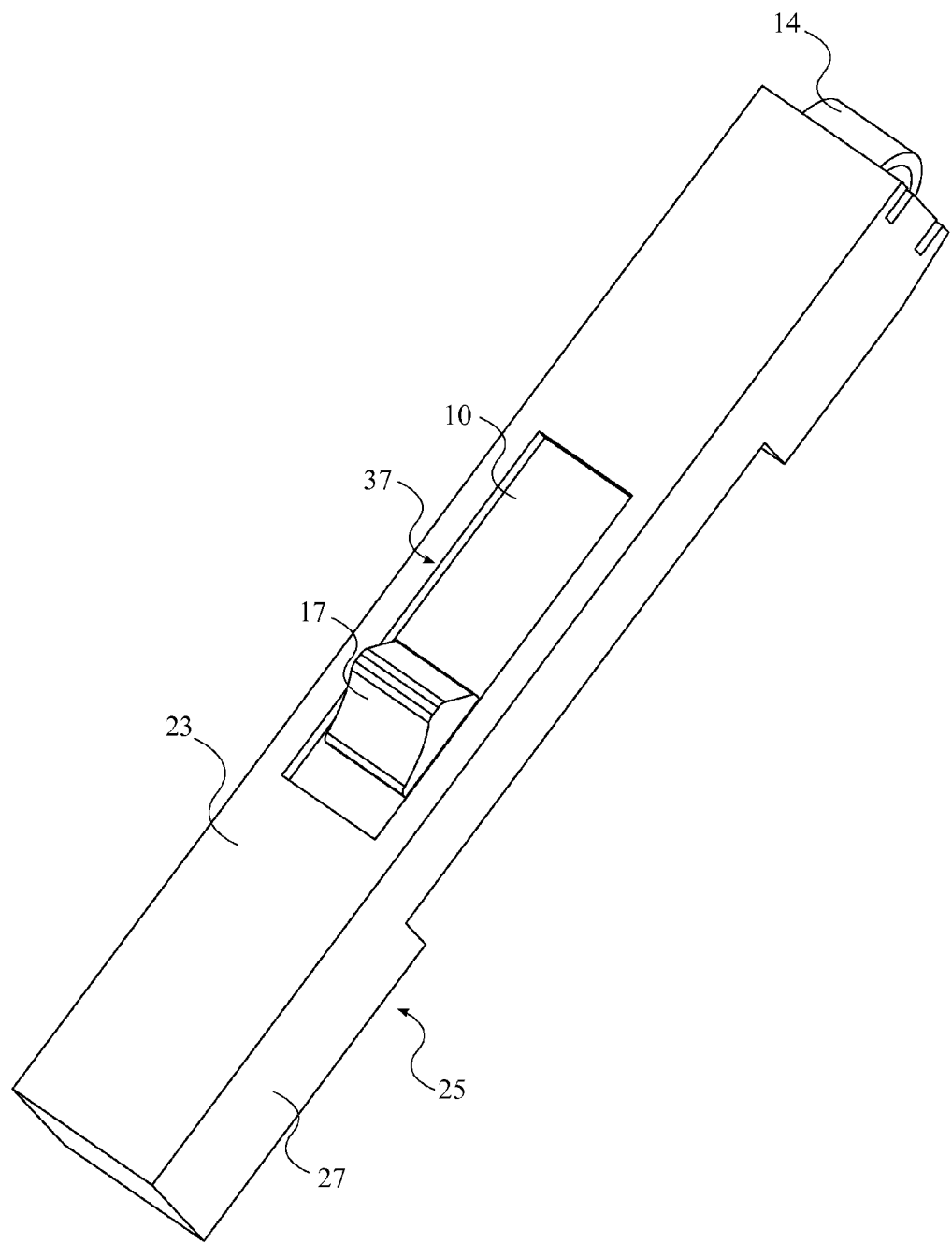
FIG. 42 is a perspective view of an alternate embodiment of the present invention, showing the "off" position.
Figure 43:
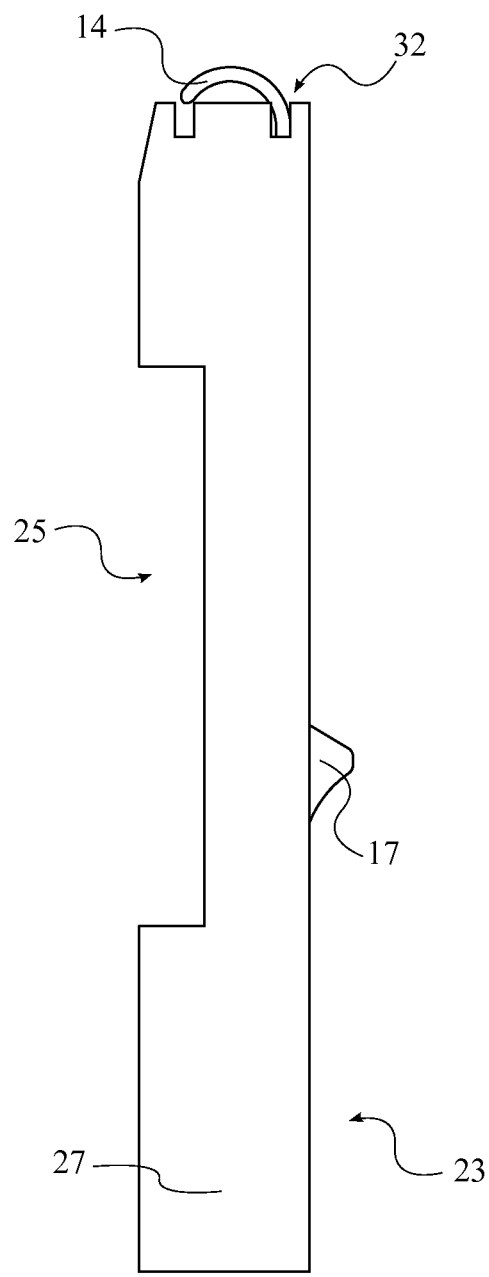
FIG. 43 is a side view of an alternate embodiment of the present invention, showing the "off" position.
Figure 44:
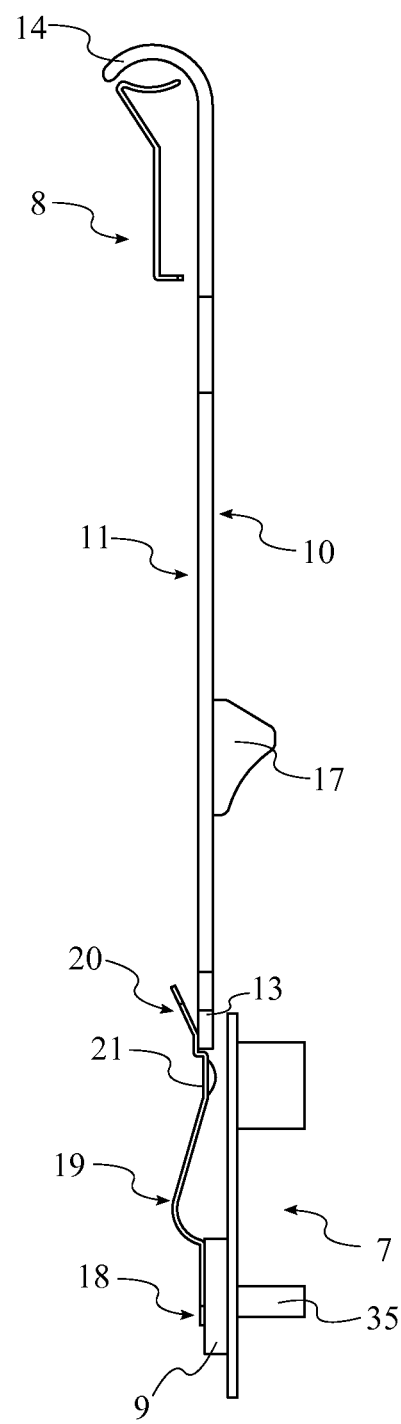
FIG. 44 is a side view of the mechanical arrangement of the inner components of the present invention, showing the "off" position.

The expansion spring 6 should provide two main functions—to tightly latch the front hook 14 onto a tested wire and to force the on-off switch 2 into the "off" position while the present invention is not testing a wire. An example of the present invention in the powered state is shown in FIG. 39-FIG. 40; FIG. 42-FIG. 43 shows an example of the present invention in the idle, unpowered state. Also, FIG. 41 shows the relations of the inner components in the powered state, while FIG. 44 shows the relations of the inner components in the idle, unpowered state. The idle state is assumed to be any instance at which the on-off switch 2 is in the "off" position, and the powered state is assumed to be any instance at which the on-off switch 2 is in the "on" position. As the second gripper end 13 is pulled towards the fixed post 24, the second gripper end 13 should come into contact with the moveable section 20 of the on-off switch 2. The moveable section 20 is angled slightly so that the second gripper end 13 will push switch downwards and away from the switch contact surface 36. If the front hook 14 is not latched onto a wire, the on-off switch 2 should remain in the "off" position. However, if the front hook 14 is latched onto a wire, then the second gripper end 13 should be positioned away from the moveable section 20 so that the contact point 21 is touching the switch contact surface 36. This causes the on-off switch 2 to be in the "on" position. The user must push the gripper knob 17 towards the front jaw 4 in order to change the position of the on-off switch 2.

An alternative embodiment of the present invention reverses the orientation of the on-off switch 2, expansion spring 6, and the sliding gripper 1. Instead of the expansion spring 6 using tension to pull the sliding gripper 1 into the moveable section 20 to keep the present invention in the idle state, the expansion spring 6 is compressed, pushing the second gripper end 13 into the moveable section 20. The present invention should function equivocally in either orientation.

Although the invention has been explained in relation to its preferred embodiment, it is to be understood that many other possible modifications and variations can be made without departing from the spirit and scope of the invention as hereinafter claimed.

What is claimed is:
1. A high voltage sensing mechanism with an integrated on-off switch comprises,
   a sliding grippers;
   an on-off switch;
   an electronics encasement;
   a rivet;
   an expansion spring;
   a metal contact plate;
   an electrical processor;
   a power source
   the sliding gripper comprises a first gripper surface, a second gripper surface, a first gripper end, a second gripper end, a front hook, a spring connector, a plurality of gripping teeth, and a gripper knob;
   the on-off switch comprises a fixed section, a knee section, a contact point, a moveable section, and a third contact;
   the electronics encasement comprises a top cover, a bottom cover, a support plate, a front jaw, a sliding passage, a hook opening, and a battery encasement;
   the top cover comprises a fixed post, and a gripper knob opening;
the battery encasement comprises a first contact, a second contact, and a power source cavity;

the expansion spring comprises a first hooking end, and a second hooking end; and the electrical processor comprises a switch contact surface, and a plurality of illuminating sources.

2. The high voltage sensing mechanism with an integrated on-off switch as claimed in claim 1 comprises, the first gripper end being positioned oppositely to the second gripper end;

the first gripper surface being positioned oppositely to the second gripper surface;

the front hook being connected to the first gripper end;

the plurality of gripping teeth being perimetrically positioned along the front hook;

the spring connector being positioned adjacently to the second gripper end; and the gripper knob being positioned atop the first gripper surface.

3. The high voltage sensing mechanism with an integrated on-off switch as claimed in claim 1 comprises, the fixed section being conjoined to the knee section;

the knee section being conjoined to both the fixed section and the moveable section;

the contact point being positioned between the knee section and the moveable section; and the third contact being secured to both the fixed section and the knee section.

4. The high voltage sensing mechanism with an integrated on-off switch as claimed in claim 1 comprises, the electrical processor being embedded within the top cover;

the fixed section being attached to the contact surface by the rivet; and the contact point being positioned below the contact surface.

5. The high voltage sensing mechanism with an integrated on-off switch as claimed in claim 1 comprises, the first hooking end being oppositely positioned to the second hooking end;

the first hooking end being attached to the fixed post; and the second hooking end being attached to the spring connector.

6. The high voltage sensing mechanism with an integrated on-off switch as claimed in claim 1 comprises, the battery encasement being embedded within the bottom cover;

the support plate being attached above the bottom cover;

the top cover being attached to the bottom cover;

the sliding passage being delineated by the top cover, and the support plate;

the hook opening traversing through the top cover into the sliding passage;

the sliding gripper being positioned between the support plate and the top cover within the sliding passage;

the front jaw being positioned adjacently to the hook opening, opposite to the sliding passage;

the gripper knob opening being traversed by the gripper knob;

the battery encasement being located between the bottom cover and the support plate;

the top cover being positioned above the support plate; and the support plate being electrically contacted with the electrical processor.

7. The high voltage sensing mechanism with an integrated on-off switch as claimed in claim 6 comprises, the front hook being located outside of the electronics encasement;

the front hook being positioned adjacently to the front jaw; and the top cover being traversed by the plurality of illuminating sources.

8. The high voltage sensing mechanism with an integrated on-off switch as claimed in claim 6 comprises, the first contact and the second contact being located within the power source cavity;

the first contact being positioned oppositely to the second contact; and the first contact and the second contact both being electrically contacted with the support plate.

9. The high voltage sensing mechanism with an integrated on-off switch as claimed in claim 6 comprises, the metal contact plate being attached to both the support plate and the front jaw; and the metal contact plate being electrically contacted with the support plate.

10. The high voltage sensing mechanism with an integrated on-off switch as claimed in claim 1 comprises, the sliding gripper being tensioned by the expansion spring, wherein the front hook is being retracted towards the front jaw.

11. The high voltage sensing mechanism with an integrated on-off switch as claimed in claim 10 comprises, the electronics processor being electrically connected to the power source, if the contact point touches the contact surface; and the power source being electrically connected to both the first contact and the second contact.

12. A high voltage sensing mechanism with an integrated on-off switch comprises, a sliding gripper;

an on-off switch;

an electronics encasement;

a rivet;

an expansion spring;

a metal contact plate;

an electrical processor;

a power source the sliding gripper comprises a first gripper surface, a second gripper surface, a first gripper end, a second gripper end, a front hook, a spring connector, a plurality of gripping teeth, and a gripper knob;

the on-off switch comprises a fixed section, a knee section, a contact point, a moveable section, and a third contact;

the electronics encasement comprises a top cover, a bottom cover, a support plate, a front jaw, a sliding passage, a hook opening, and a battery encasement;

the top cover comprises a fixed post, and a gripper knob opening;

the battery encasement comprises a first contact, a second contact, and a power source cavity;

the expansion spring comprises a first hooking end, and a second hooking end;

the electrical processor comprises a switch contact surface, and a plurality of illuminating sources;

the sliding gripper being tensioned by the expansion spring, wherein the front hook is being retracted towards the front jaw;

the electronics processor being electrically connected to the power source, if the contact point touches the contact surface; and the power source being electrically connected to both the first contact and the second contact.

13. The high voltage sensing mechanism with an integrated on-off switch as claimed in claim 12 comprises, the first gripper end being positioned oppositely to the second gripper end;

the first gripper surface being positioned oppositely to the second gripper surface;

the front hook being connected to the first gripper end;

the plurality of gripping teeth being perimetrically positioned along the front hook;

the spring connector being positioned adjacently to the second gripper end; and the gripper knob being positioned atop the first gripper surface.

14. The high voltage sensing mechanism with an integrated on-off switch as claimed in claim 12 comprises, the fixed section being conjoined to the knee section;

the knee section being conjoined to both the fixed section and the moveable section;

the contact point being positioned between the knee section and the moveable section; and the third contact being secured to both the fixed section and the knee section.

15. The high voltage sensing mechanism with an integrated on-off switch as claimed in claim 12 comprises, the electrical processor being embedded within the top cover;

the fixed section being attached to the contact surface by the rivet;

the contact point being positioned below the contact surface;

the first hooking end being oppositely positioned to the second hooking end;

the first hooking end being attached to the fixed post; and the second hooking end being attached to the spring connector.

16. The high voltage sensing mechanism with an integrated on-off switch as claimed in claim 12 comprises, the battery encasement being embedded within the bottom cover;

the support plate being attached above the bottom cover;

the top cover being attached to the bottom cover;

the sliding passage being delineated by the top cover, and the support plate;

the hook opening traversing through the top cover into the sliding passage;

the sliding gripper being positioned between the support plate and the top cover within the sliding passage;

the front jaw being positioned adjacently to the hook opening, opposite to the sliding passage;

the gripper knob opening being traversed by the gripper knob;

the battery encasement being located between the bottom cover and the support plate;

the top cover being positioned above the support plate;

the support plate being electrically contacted with the electrical processor;

the front hook being located outside of the electronics encasement;

the front hook being positioned adjacently to the front jaw;

the top cover being traversed by the plurality of illuminating sources;

the first contact and the second contact being located within the power source cavity;

the first contact being positioned oppositely to the second contact;

the first contact and the second contact both being electrically contacted with the support plate;

the metal contact plate being attached to both the support plate and the front jaw; and the metal contact plate being electrically contacted with the support plate.

* * * * *